United States Patent [19]
Galarneau et al.

[11] Patent Number: 5,597,613
[45] Date of Patent: Jan. 28, 1997

[54] SCALE-UP PROCESS FOR REPLICATING LARGE AREA DIFFRACTIVE OPTICAL ELEMENTS

[75] Inventors: Lynn Galarneau, Golden Valley; Daniel J. Rogers, White Bear Lake, both of Minn.

[73] Assignee: Honeywell Inc., Minneapolis, Minn.

[21] Appl. No.: 366,853

[22] Filed: Dec. 30, 1994

[51] Int. Cl.$^6$ ................................................. B05D 5/06
[52] U.S. Cl. ...................... 427/162; 427/269; 427/271; 427/358; 427/369; 427/371; 427/389.7; 427/510; 427/385.5; 427/240
[58] Field of Search .................................. 427/162, 269, 427/271, 358, 369, 371, 389.7, 510, 385.5, 240

[56] References Cited

U.S. PATENT DOCUMENTS

| | | | |
|---|---|---|---|
| 4,933,120 | 6/1990 | D'Amato et al. | 427/256 |
| 5,116,548 | 5/1992 | Mallik et al. | 427/162 |
| 5,188,863 | 2/1993 | de Graaf et al. | 427/162 |
| 5,300,190 | 4/1994 | Sugimoto et al. | 156/658 |

FOREIGN PATENT DOCUMENTS 2034542  1/1991  Canada.

OTHER PUBLICATIONS

F. Shvartsman, Replication of Diffractive Optics, Critical Reviews on Diffractive and Miniaturized Optics, SPIE vol. CR49, 1993 (no mo.).

Primary Examiner—Janyce Bell
Attorney, Agent, or Firm—Paul H. McDowell

[57] ABSTRACT

The present invention discloses 1) a process for photopolymer replication on plastics, and 2) the scale-up step-and-repeat process in photopolymers. High fidelity optical element replication using a master optical element having submicron diffractive pattern feature sizes embossed into a UV curable photopolymer material for step-and-repeat "tiling" replication of the master optical element to create light weight, low cost, large area diffractive optical elements (LADOE). Furthermore, by using a chrome mask to eliminate ridge formation around a single diffractive optic element extremely narrow seams result, thereby increasing the optical fidelity of the resulting LADOE. Accordingly, each LADOE made according to the present invention is characterized by having minimum seam widths between patterns of discrete diffractive optic elements that introduce negligible optical distortion to a viewer.

21 Claims, 10 Drawing Sheets

~10μm Seam Width
Ni Tool Tiling

< 10μm Seam Width
Ste-and-Repeat Tiling in Photopolymers

SCALE-UP PROCESS FOR REPLICATING LARGE AREA DIFFRACTIVE OPTICAL ELEMENTS

CROSS REFERENCE TO RELATED APPLICATION

The present patent application is related to Ser. No. 08/366,852 titled "HIGH FIDELITY REPLICATION PROCESS FOR DIFFRACTIVE OPTICAL ELEMENTS," filed on even day herewith, of common ownership and inventorship.

FIELD OF THE INVENTION

A low-cost process for high quality replication of diffractive optic elements, and more particularly, a tiling process in which individual diffractive optic master elements are replicated into large area diffractive optic element masters exhibiting superior optical qualities and negligible seam width utilizing a special fixture having diffuse absorbing surfaces in contact with the optic master and the replication medium.

BACKGROUND OF THE INVENTION

In the past ten years, diffractive optics technology evolved from a novel area of research to a new and powerful tool for optical designers. Major technical advances in diffractive optics technology include low cost alternatives to aspheric lenses, new solutions to aberration correction of refractive optic elements, and new devices such as moth's eye structures and beam multiplexers.

Conventional fabrication techniques for diffractive optics include diamond turning, semiconductor mask/etch processing, and injection molding. Except for injection molding, these fabrication techniques are very expensive, and injection molding is only applicable to fabricating plastic diffractive optics. Conventional master fabrication techniques are typically limited to covering areas from a few square inches to less than a square centimeter depending on the complexity and aspect ratio of diffractive pattern. With a process for integrating smaller master elements into larger area masters we can make the crucial advancement of the practical application of diffractive optics to polarizers for visual displays applications.

SUMMARY OF THE INVENTION

The present invention offers dramatically reduced manufacturing costs, provides additional weight reduction using a high fidelity replication process, and is capable of large area diffractive optic element (LADOE) replication. The process for "tiling" small master elements into larger optical elements is a crucial advancement for the practical application of diffractive optics to many useful applications, such as polarizers for visual displays.

A low cost process for replicating diffractive optic elements using ultraviolet (UV) curable photopolymers on resin substrates disclosed herein with reference to two-level and eight-level f/10 quartz master elements embossed into photopolymers then cured under high intensity UV radiation such as a UV curing lamp, and subsequently tiled in to a LADOE of choice. The quartz master easily separates from the cured replica and is immediately available for reuse. High fidelity replication of surface relief structures as produced in accord with the present invention have been verified using an optical microscope, a Scanning Electron Microscope (SEM), and a 2D scanning profilometer in the sense that they exhibited near theoretical diffraction efficiency (39.4% vs. 40.5%) with the two-level f/10 replica. However, it is not unusual to find that a portion of the optical image slightly degraded, which is typically evidenced by a slight distortion of the blur spot.

The present invention involves the use of high fidelity master optical elements for generating large area diffractive optical element (LADOE) patterns for several applications such as polarizers and anti reflective surfaces made up of individual master elements fabricated by semiconductor mask/etch processing are limited to areas of a few square inches. A scale-up process using a step-and-repeat technique, involving radiation curable photopolymers, creates LADOE patterns from smaller single quartz master elements having seam widths less than 10 microns. The seam width is critical to generating high quality optics and is attained by using a radiation-opaque metal mask deposited onto the periphery of a quartz master element thereby limiting undesired curing of areas adjacent to the replica being fabricated. The mask operates in cooperation with a carefully tuned radiation source to enable selective curing of each discrete replica during the fabrication sequence while leaving the remaining portion of the substrate uncured until the tiling process is to completed.

The diffractive optical master elements of the present invention, when integrated into various optical systems (e.g. head/helmet mounted displays) offer the advantages of compact size, weight, cost reduction (in terms of assembly and field support), and reduced optical distortion over conventional optical systems.

Thus, we have discovered that a large area diffractive optic nickel master can be produced from a multi-tiled plastic replica, which master enables the embossing of sheets of various polymers with suitable durability for the ultimate application.

A preferred material made by the DuPont Company has shown excellent optical image quality using their solid sheet photopolymer, Surphex—a trademark, which has extremely low shrinkage (<0.1%). In addition to providing excellent optical image quality, the Surphex material also provides ease of fabrication using the step-and-repeat process herein described. A solid sheet of Surphex material eliminates spill over and the "flooding" phenomena sometimes associated with the use of liquid photopolymers wherein unwanted excess material seeps onto bordering tiles. Surphex, which is a dry photopolymer, used in the step-and-repeat process, has the potential for easier processing for tiling because it virtually eliminates this flooding.

Use of the present invention for improvements of flat panel displays will require sample sizes on the order of 8 inches square. These large area submicron patterns could also be produced via step-and-repeat techniques using either Surphex or liquid photopolymers.

This step-and-repeat technology is considered an extremely important approach for providing the path to manufacturing scale-up of low cost large area diffractive optical elements.

Nickel electroforming as taught herein to produce high quality replicas from cured photopolymer replicas provides advantages in that a scaled-up sample fabricated using the step-and-repeat technique is then plated with a material to form a LADOE nickel electroform tool with very small seam widths. These nickel electroform tools are extremely durable and can be used for embossing a specific LADOE into the final preselected material for a given product/application.

For example, using UV curable acrylic hardcoat, extremely high fidelity replicas can be made from quartz or nickel masters. With a quartz master, the diffractive pattern is embossed onto a resin substrate which has been appropriately coated with a radiation curable polymer, such as being spin coated, dipped, or rolled into material thereby uniformly covering the substrate. In the case of a nickel master, a UV transparent resin substrate is required for curing. After curing, the master can be physically separated from the replica, leaving both intact and the master ready for subsequent replications.

The process of the present invention used for replication of a LADOE depends on several key parameters to achieve high transfer fidelity in a transfer material. These parameters include: photopolymer material, spin coating time and speed or dry photopolymer thickness, pressure applied, UV exposure intensity and time, and the technique used for separating the master from the replica.

DETAILED DESCRIPTION OF THE PREFERRED EMBODIMENT

The material chosen for this process was Gafgard 233, a trademark of GAF Corporation which is a UV curable acrylate photopolymer. It was chosen for replication because of good characteristics of adhesion to plastics, high moisture resistance, solvent resistance and relatively low shrinkage during and after radiation induced curing. Although those skilled in the art will recognize that other materials that exhibit similar properties may also be used in accord with the present invention. Gafgard 233 is comprised of 100% solids, so no volatiles are given off during cure. It is noteworthy that existing liquid photopolymers such as Gafgard 233 are not optimized for step-and-repeat applications due to their "messy" state as the excess material flows into the neighboring regions and the uncured liquid must be washed away. However, high fidelity nickel tools can be made from Gafgard replicas. But generally, solid photopolymers work quite well in accord with the present invention.

Figure 1:
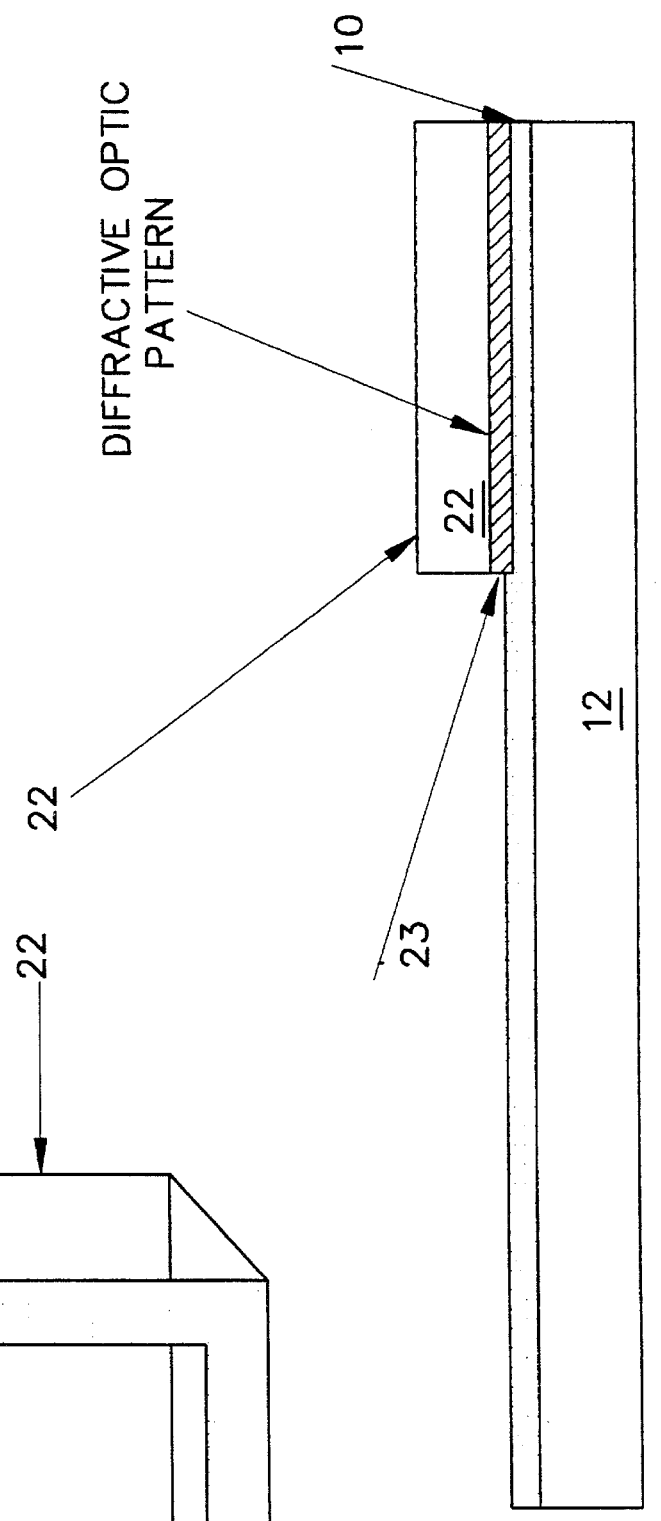
FIG. 1A is a elevational view in cross section of a discrete replication technique from a single diffractive master to a portion of a substrate-based LADOE.
FIG. 1B is a perspective view of the quartz master having a film of radiation opaque material on a surface thereof.
Figure 2:
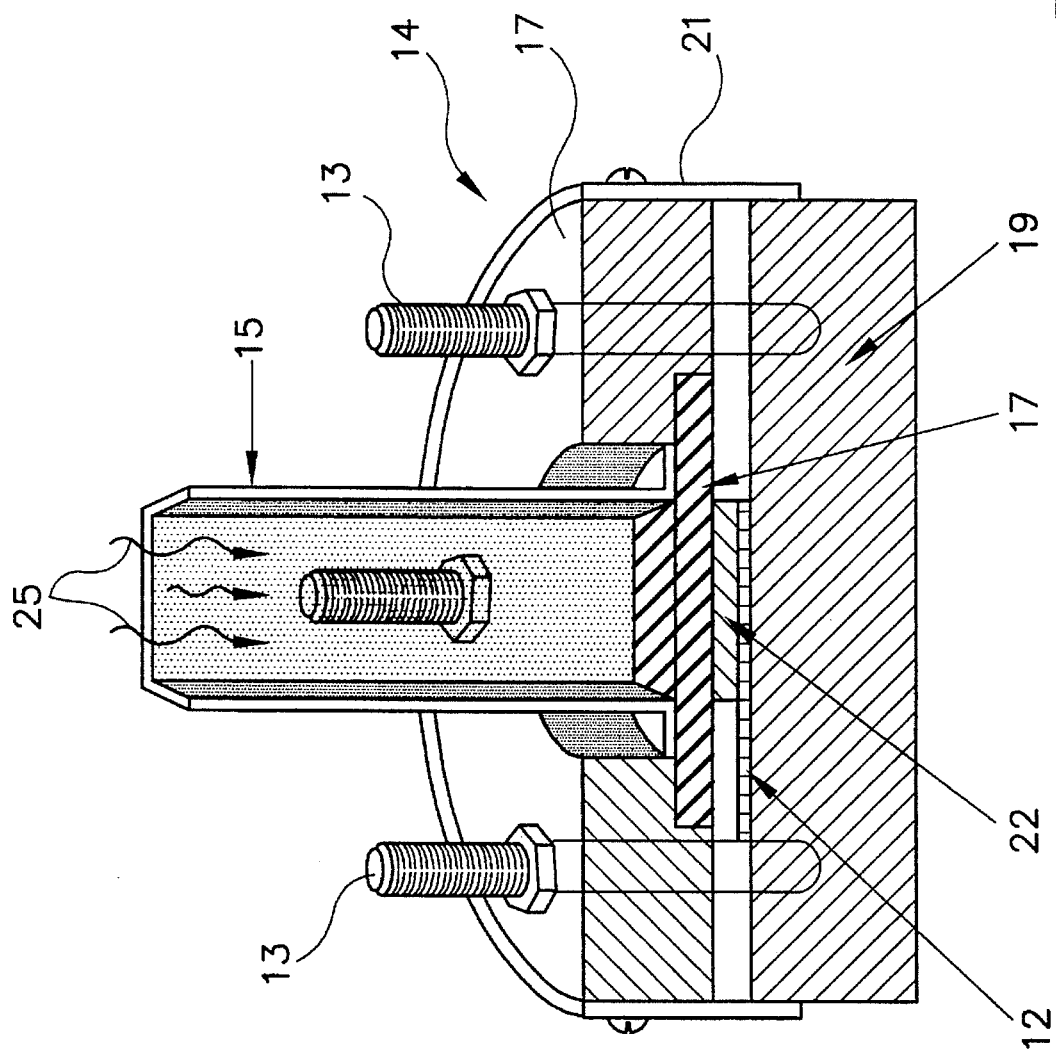
FIG. 2 is an elevational cross section of a fixture usable for replicating diffractive optical elements according to the present invention.

Thus, referring to FIG. 1, a liquid photopolymer 10 uniformly coated, for example by directing a flow of photopolymer 10 onto an UV transparent acrylic, resin, or polycarbonate substrate 12 and then spin coated at speeds of 750 rpm for about 7.5 seconds, for example, in order to generate a uniform coating. Spin speeds greater than this can reduce the film thickness of the photopolymer 10 to make it too thin to allow for sufficient material coverage to produce the step-and-repeat patterns. Often, a coating of photopolymer 10 which has not been not spun on as described, but rather has been applied by dipping substrate 12 into the material were too thick and cracked upon curing.

Thereafter, in one embodiment, pressure is applied with a 12-ton hydraulic press, not shown, upon a fixture 14 holding a quartz master 22 and thereby set using the specially designed fixture 14 which has a quartz window 17 to allow curing while under pressure. As is known, an ultraviolet curing system 18, not shown, operates at 300 Watts/inch, thereby curing replica 44 on a face of the substrate 12 within less than twenty (20) seconds, given a typical exposure of between 5–50 J/cm$^2$ with a HeNe laser source. After curing, the replica 44 is removed from the fixture 14 and separated using a sharp edged instrument placed between the master 22 and the replica 44. The master 22 is then rinsed with acetone to clean it and thereafter the master 22 is ready for embossing another replica 44. The measured diffraction efficiency of a typical two-level replica of an f/10 Fresnel phase lens made in accord with the present invention is 39.4%, as compared to the theoretical value of 40.5%. For this work, the theoretical value is calculated assuming the measured step height of 568 nm, a refractive index of 1.525, and characterization with a HeNe laser at 633 nm.

In one embodiment the fixture 14 has a chimney 15 for admitting radiation from a remote device so that only the portion of substrate 12 underneath the chimney 15 will receive the curing radiation. Coupled to the chimney 15 with a nut and bolt or other releasable combination is a cap member 17 which in turn connects to a base member 19. Further aligning mechanisms may be used such as 21 to precisely align cap 17 to base 19 so that an assembly comprising the substrate 12, photopolymer 10, and the portion of the master element 22 defined by the perimeter of radiation opaque material 23 for retaining the replica 44 in place during the replication process.

With an effective masking technique, subsequent replications are performed on the same substrate 12 in a fashion similar to tiling a floor or other surface, one course at a time. Care must be taken to prevent curing of the adjacent tiles during the tiling process and in one embodiment a 300 Å layer of chrome 23 was deposited in a window frame pattern onto a surface of the quartz diffractive master 22 prevents any curing beyond the area of immediate interest. In one embodiment, stray reflections and scatter of UV radiation are prevented by using diffuse absorbing surfaces, such as black anodized aluminum on fixture 14 when fabricating replicas and for shielding other area from impact by the radiation 25.

Efforts to replicate LADOE of considerable coverage area using the tiling technique described herein using master optical elements made of nickel were largely unsuccessful. It has been found that when using nickel the curing radiation 25 must originate from the backside of a UV transparent substrate 12, and thus it is very difficult to adequately confine the area of curing. Even collimated UV laser radiation could not be confined adequately because of scattering from the diffractive element and multiple reflections within the UV transparent substrate 12.

Figure 8A:
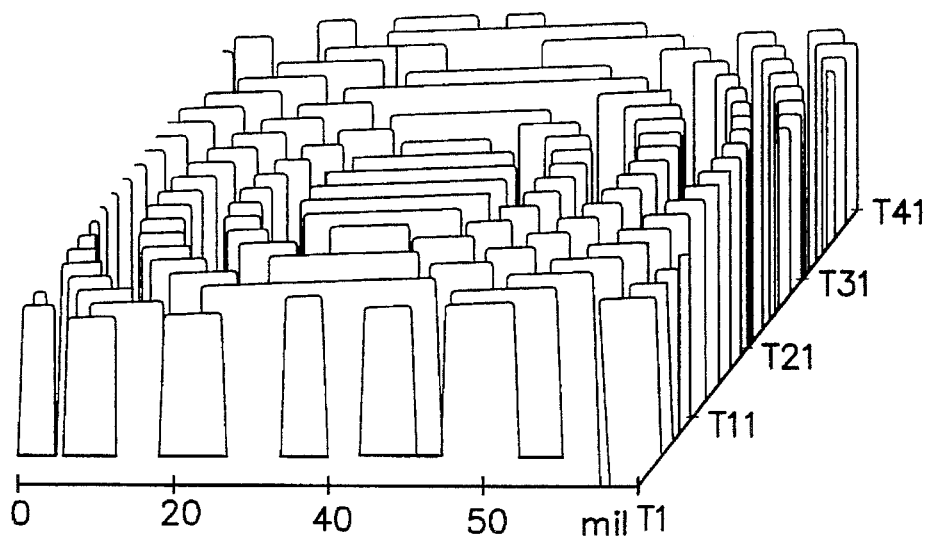
FIG. 8 is a 2D profilometer scan of an experimental attempt at replication of a on an f10 diffractive lens using an UV curable liquid photopolymer.
Figure 8B:
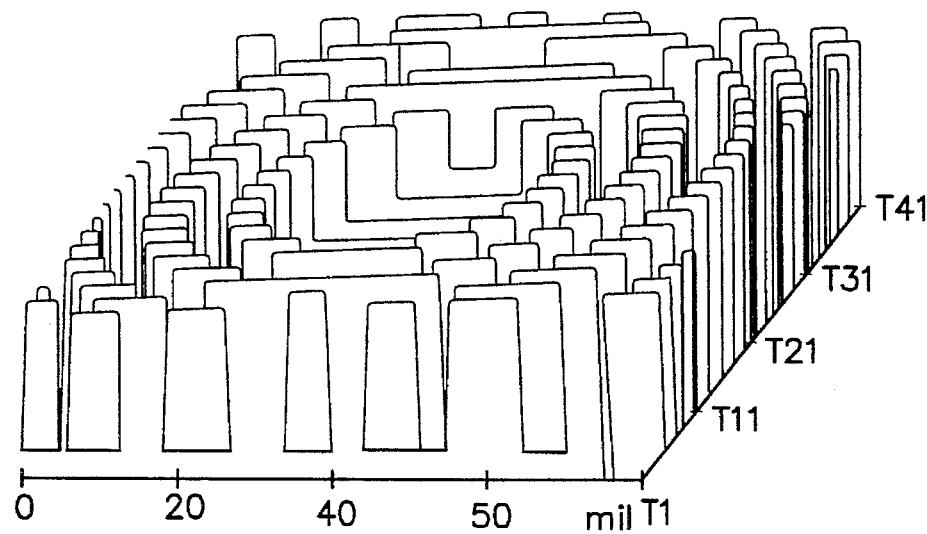

In one embodiment two-and eight-level quartz f/10 Fresnel phase lenses and various patterned Ni electroforms were used as the replicating masters. The high fidelity as shown in FIG. 8 by performing a 2D profilometer scan with a Tencor profilometer across both the master 22 and the replica 44 of the f/10 element used as an example of the present invention herein. As can be seen, the pattern is replicated very accurately in the replica 44 with less than a 10% difference in the depth of the features, and most likely attributable to shrinkage in the photopolymer.

Figure 5B:
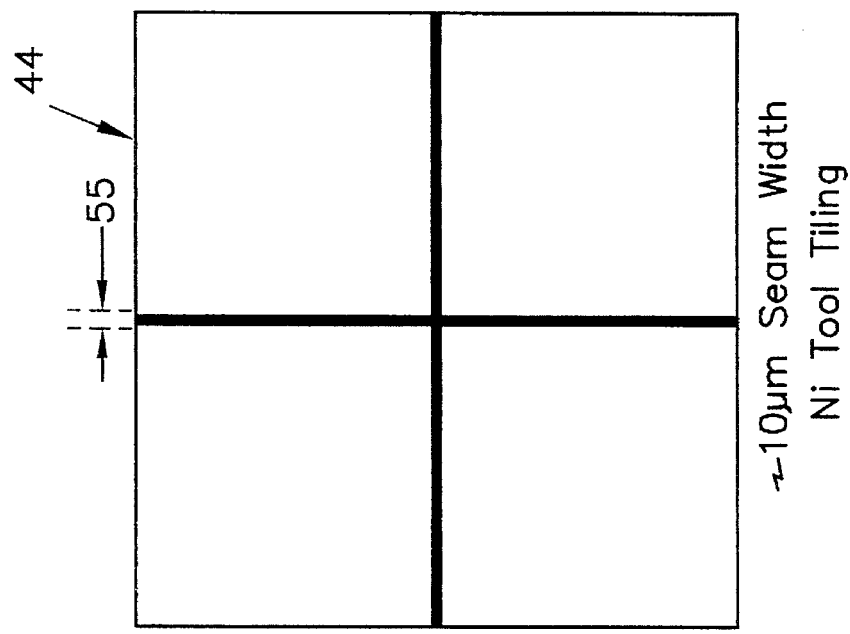
FIG. 5 is a plan view of two sets of four adjacent replicated optical elements, the first set made using the method of the present invention and the second set made with a prior art approach.
Figure 5A:
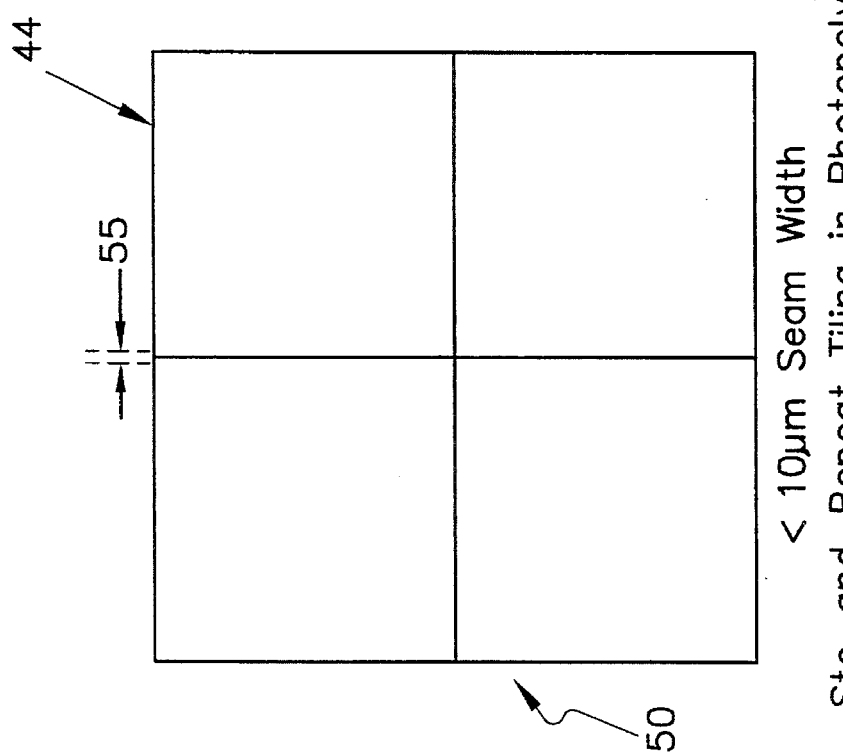

Optical microscopy illustrates the high level of transfer fidelity from the f/10 pattern using a glass master in accord with the present invention when comparing photomicrographs of the replica 44 to the master 22, both elements were dimensionally indistinguishable from each other to better than 0.1% in the horizontal plane of the substrate. Linear dimensional stability may be due to curing of the photopolymer under pressure, although material shrinkage during curing appears to be limited to the vertical step dimension. The widths of seams 55 were also determined using the optical microscope, as shown in FIG. 5, and between replicas were shown to be approximately 7 microns. A significant improvement over Ni tool tiling where minimum seam widths are typically 50–75 microns. The step height at this seam was measured to be 5.7 µm using a Tencor profilometer. High fidelity replication down to micron feature sizes is confirmed using a Scanning Electron Microscope.

Figure 6A:
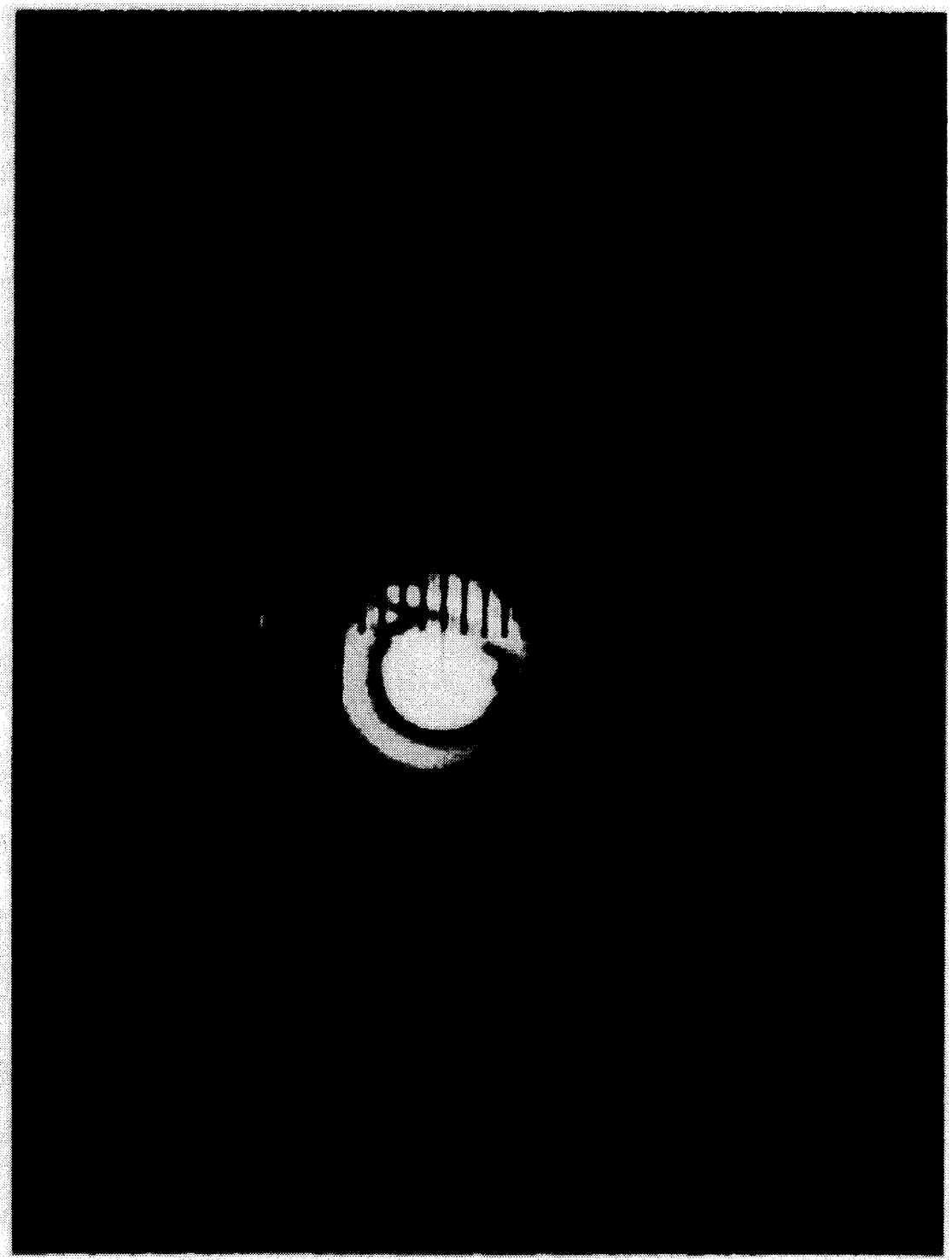
FIG. 6 A, B and C are photographic depictions of a blur spot on a two level f/10 quartz master (in A) and of the reproduced blur spot on a replica of the quartz master after embossing into a good quality substrate (in B and C).
Figure 6B:
Figure 6C:
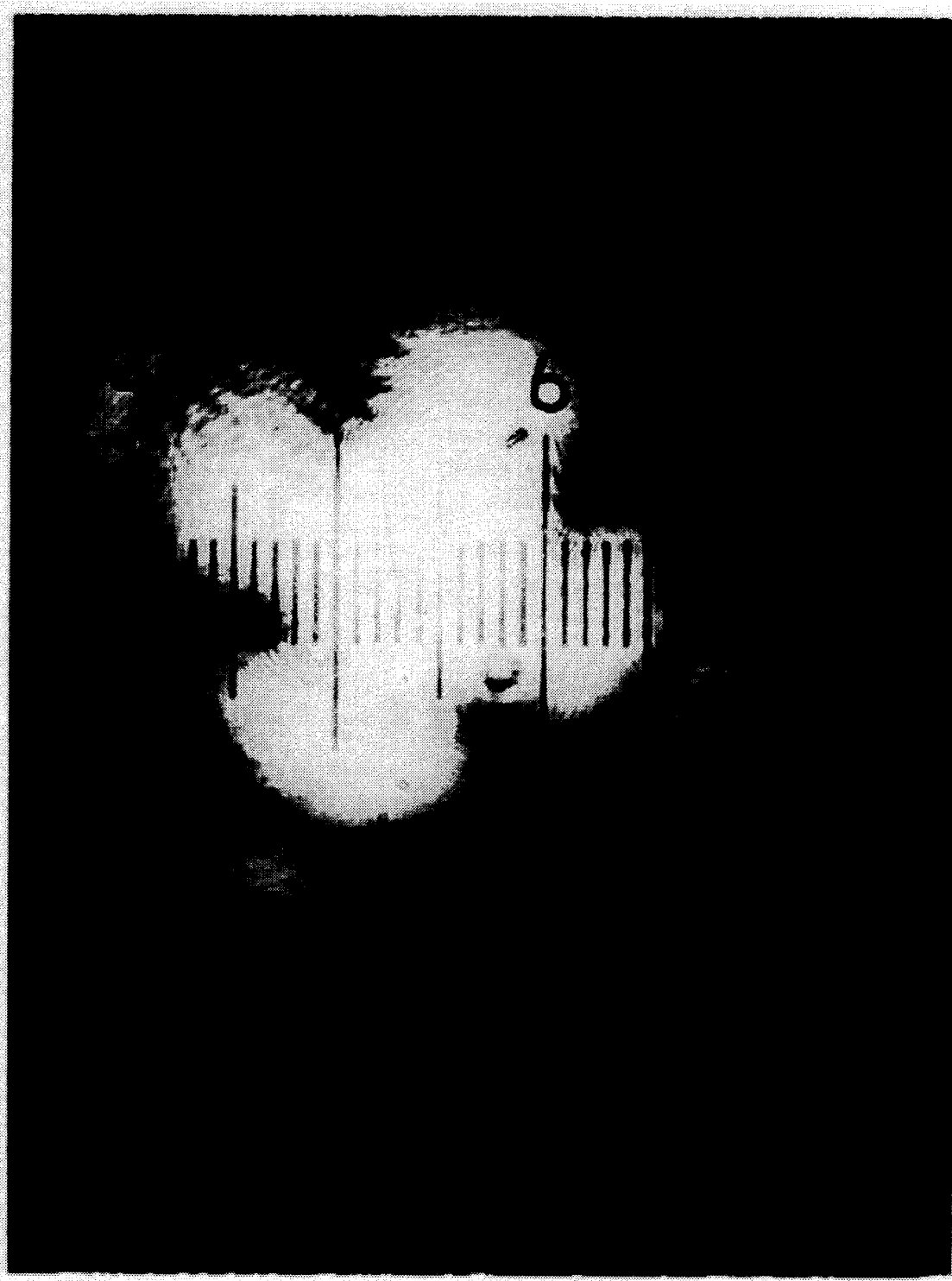

Although replication of LADOE by tiling transmissive elements is the first priority of this effort, optical image quality was examined by documenting the blur spots and diffraction efficiency of an original glass master 22 and a replica 44 therefrom. A typical blur spot for an f/10 two-level quartz master (Q2) is shown in FIG. 6A, the optical distortion shown may be introduced with the tensile stress of the photopolymer material which may cause warping of the substrate. Evidence of this is seen while observing a replica's blur spot when embossed on a good optical quality substrate 12, as seen in FIGS. 6B and 6C. The optical distortion of such a blur spot may also be due to the roughness that may be shown by SEM photos.

The step-and-repeat process using photopolymers has several key advantages over the nickel electroforming technology presently used for scaling up to larger sample sizes. Nickel electroforming is relatively time consuming and thus costly. The minimum seam widths possible using the Ni tiling technique are approximately 50–70 µm. Seam widths of this size can cause significant optical distortion. Step-and-repeat tiling in photopolymers can routinely produce seam widths less than 10 µm using an opaque metal mask deposited onto the quartz master (see FIG. 1).

The basic process for step-and-repeat replication using photopolymers is illustrated in FIG. 1. The photopolymer is sandwiched between the quartz master element and a UV absorbing substrate. The photopolymer film is then cured under high intensity UV radiation through the quartz master. A 300 Å layer of chrome deposited in a window frame pattern onto the quartz diffractive master surface prevents any curing beyond the area of interest. Stray reflections and scatter of UV radiation are prevented by using diffuse absorbing surfaces when fabricating fixtures and shielding.

Figure 3A:
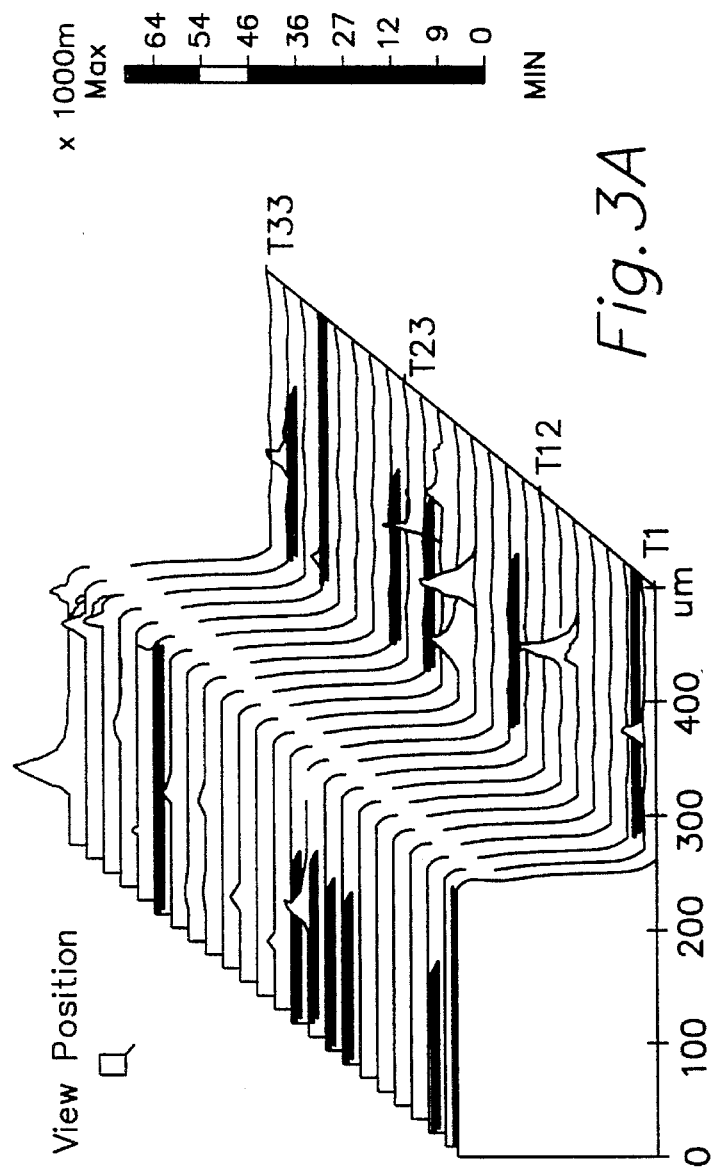
FIG. 3 is a profilometer scan of the step height of a seam of a diffractive optical element.
Figure 3B:
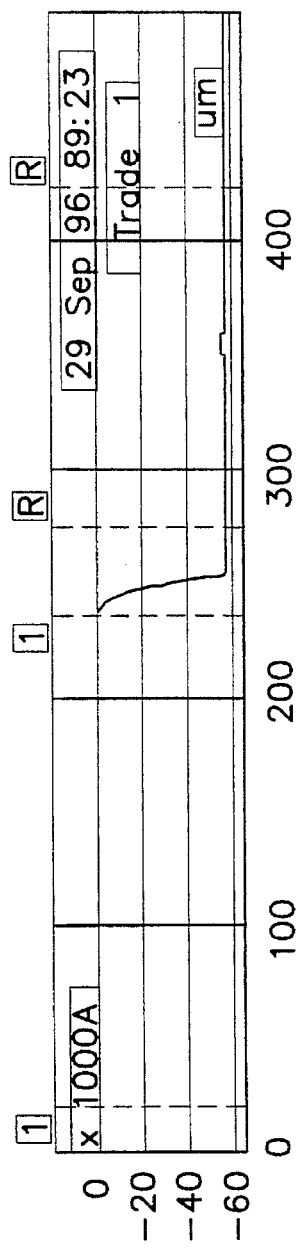
Figure 4:
FIG. 4 is a photomicrograph illustrating the seam width of two adjacent replicated optical elements.

The seam widths were determined using the optical microscope. FIG. 4 shows the width between replicas to be approximately 7 µm which is a significant improvement over Ni tool tiling where minimum seam widths are typically 50–70 µm. The step height at this seam was measured to be 5.7 µm using the Tencor profilometer as shown in FIG. 3.

These scale-up multi-tiled photopolymer replicas can then be nickel plated to produce a high quality Ni tool which is extremely durable. The advantage here is that a scaled-up sample can be fabricated quickly and efficiently in the photopolymer using the step-and-repeat technique and then plated to form a large area nickel tool with very small seam widths. This end product enables the embossing of sheets of various polymers with suitable durability for the end application.

Figure 7:
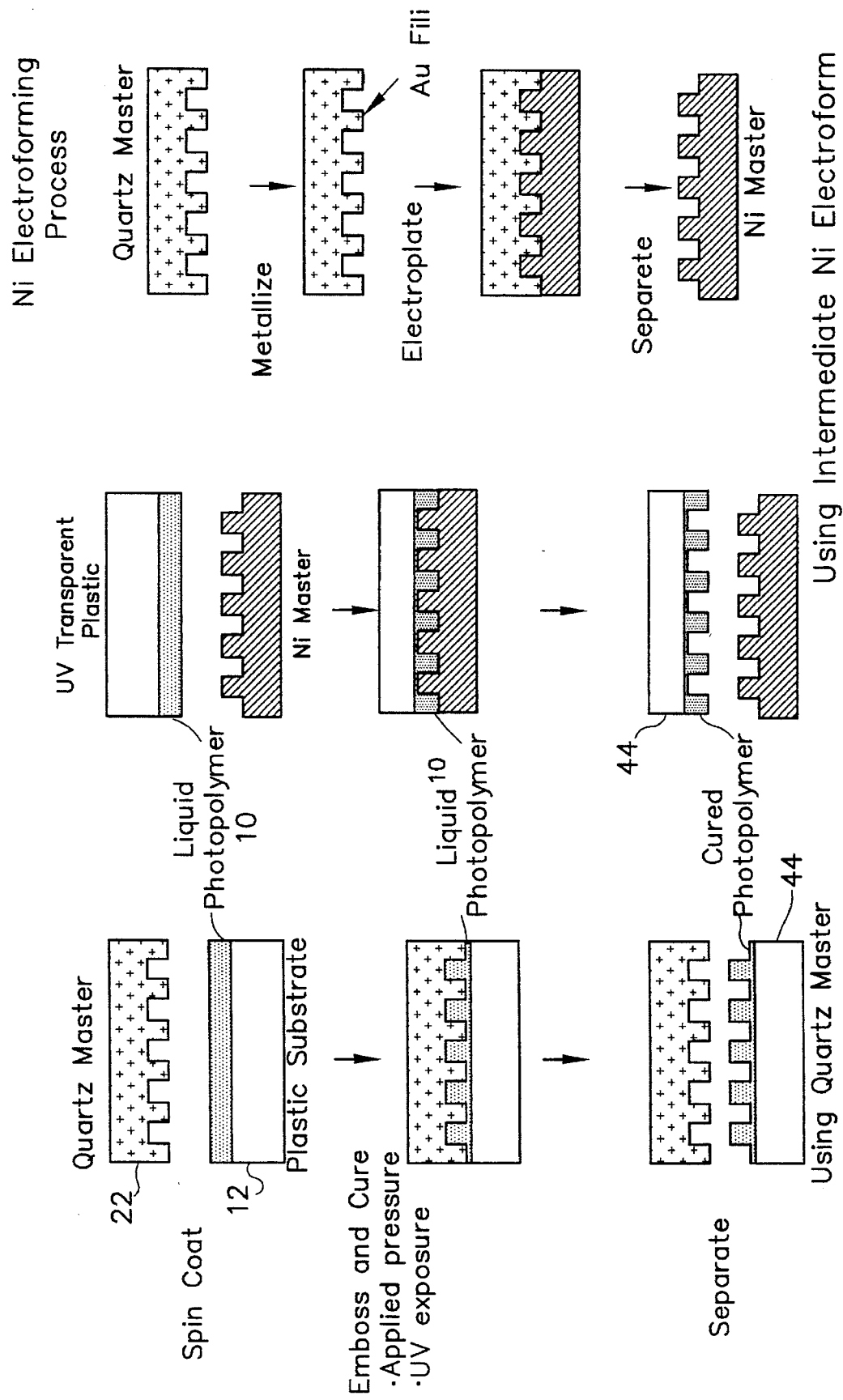
FIG. 7 depicts a variety of process steps for creating discrete replicas, from a quartz master and from a nickel master.

As shown in FIG. 7, a variety of techniques can be used in fabricating acceptable master optical elements for embossing the optical element replicas. One of skill in the art will recognize that the process of the present invention finds utility for a great variety of precision optical element replication sequences.

While the present invention has been described with reference to certain embodiments, it will be apparent to one of skill in the art that various embodiments involving elements of design choice to such a person will come within the spirit and scope of the present invention as defined in the following claims:

We claim:

1. A method of creating large area diffractive optical elements from smaller diffractive optical elements, comprising the steps of:
   a) applying a layer of radiation curable photopolymer material to one side of a substrate member;
   b) contacting a portion of the layer of photopolymer material with a face of a master optical element so that the master optical element transfers a pattern on the face of the master optical element;
   c) placing the substrate member and the master optical element into a fixture means for receiving and aligning the substrate member to the master optical element and for coupling a remote radiation source to the portion of the layer of the radiation curable photopolymer;
   d) applying radiation to the fixture means and ultimately to the portion of the layer of photopolymer material so that the portion of the layer of photo polymer material cures; and,
   e) removing the fixture means and repeating steps b through d, wherein the portion of the layer of photopolymer material is adjacent a previously cured portion.

2. The process of claim 1, wherein the photopolymer material comprises a liquid photopolymer material.

3. The process of claim 2, further comprising:
   depositing a layer of radiation-opaque material around the perimeter of the select portion of the layer of photopolymer material before applying radiation.

4. The process of claim 3, wherein the master optical element comprises a quartz material, and the radiation-opaque material comprises a metal.

5. The process of claim 4, wherein the substrate is a resin material.

6. The process of claim 4, wherein the fixture means further comprises a plurality of nuts and bolts suitably positioned to align and retain the substrate member, the master optical element, and the radiation from the remote source.

7. The process of claim 1, wherein the fixture means further comprises:
   placing a planar quartz window between the means for coupling the remote radiation source and the master optical element.

8. The process of claim 4, wherein the fixture means comprises a base member releaseably coupled to a cap member, and the process further comprises:

placing the fixture means in a device for imparting compressive stress to opposing sides of the cap member and the base member so that the master optical element, the substrate member, and the photopolymer are in compressed communication while the remote radiation source bombards the photopolymer.

9. The process of claim 1, further comprising the steps of:

changing the master optical element with a different master optical element; and applying the master optical element and the different master optical element in turn so that macro optical effects result when the process is complete.

10. The process of claim 1 wherein the remote radiation source comprises a UV radiation source.

11. A process for replicating large area diffractive optical elements from smaller optical elements, comprising the steps of:

a) coating one side of a substrate with a radiation curable photopolymer;

b) placing a smaller optical element with a diffractive optical pattern on one side thereof in contact with a portion of the photopolymer;

c) pressing the substrate and the smaller optical element together with force sufficient to impress the diffractive optical pattern into the photopolymer;

d) applying radiation to the photopolymer so that the portion of the photopolymer cures where the smaller optical element presses against said photopolymer;

e) releasing the pressing force;

f) removing a assembly of the substrate, the photopolymer, and the smaller optical element;

g) separating the smaller optical element from contact with the photopolymer; and h) repeating steps b through g, wherein a portion of the photopolymer in contact with the smaller optical element is a different portion contacted in step (b).

12. The process of claim 10, wherein the smaller optical element comprises a quartz master optical element.

13. The process of claim 11, wherein the radiation is incident upon the photopolymer after being transmitted through the substrate.

14. The process of claim 11, wherein the substrate is a resin material.

15. The process of claim 14, wherein the substrate is relatively flat.

16. The process of claim 11, wherein the smaller optical element comprises a metal material.

17. The process of claim 16, wherein the metal material is nickel.

18. The process of claim 11, further comprising the step of applying a radiation-opaque material at the periphery of the diffractive optical pattern on the smaller optical element before placing the smaller optical element in contact with a portion of the photopolymer.

19. A process for creating low weight, low-cost, high fidelity large area diffractive optical elements, comprising the first step of:

coating a substrate with a layer of ultraviolet curable photopolymer material; and then repeating the following sequence of steps:

a) contacting a portion of the layer of said ultraviolet curable photopolymer material with a diffractive optical pattern from a master optical element;

b) applying pressure to compress the photopolymer material into the diffractive optical pattern of said master optical element;

c) curing said portion of the layer of said photopolymer material with a remote source of ultraviolet radiation; and, d) releasing the pressure applied to compress the photopolymer material into the diffractive optical pattern;

so that each successive portion appear side-by-side.

20. The process of claim 19, further comprising the step of:

e) optionally using a different diffractive optical pattern rather than said diffractive optical pattern at step (a) so that the cured portions of the layer of said photopolymer material appear to cooperate on a macroscopic scale when viewed by a human viewer.

21. The process of claim 19, wherein the master optical element comprises quartz material.

* * * * *

UNITED STATES PATENT AND TRADEMARK OFFICE
CERTIFICATE OF CORRECTION

PATENT NO.  : 5,597,613
DATED       : 01/28/97
INVENTOR(S) : Galarneau, et al.

It is certified that error appears in the above-indentified patent and that said Letters Patent is hereby corrected as shown below:

In the claims:

Column 6, Line 31 before "portion" insert --select--

Column 6, Line 38 before "portion" insert --select--

Column 6, Line 41 before "portion" insert --select--

Column 6, Line 45 before "portion" insert --select--

Column 6, Line 46 before "portion" insert --select--

Signed and Sealed this

First Day of April, 1997

Attest:

BRUCE LEHMAN

*Attesting Officer*   *Commissioner of Patents and Trademarks*